(12) United States Patent
Tsai

(10) Patent No.: US 6,594,594 B1
(45) Date of Patent: Jul. 15, 2003

(54) METHOD FOR UNIQUE DETERMINATION OF FET EQUIVALENT CIRCUIT MODEL PARAMETERS

(75) Inventor: Roger Su-Tsung Tsai, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 112 days.

(21) Appl. No.: 09/680,339

(22) Filed: Oct. 5, 2000

Related U.S. Application Data

(60) Provisional application No. 60/200,436, filed on Apr. 28, 2000.

(51) Int. Cl.[7] .................................................. G01R 25/00
(52) U.S. Cl. ...................... 702/65; 702/65; 702/117; 702/189; 324/600; 324/629; 324/649; 324/658; 716/2; 716/4
(58) Field of Search ................................ 702/1, 57, 64, 702/65, 66, 69, 79, 108, 117, 119, 120, 123, 124, 182, 183, 189; 324/600, 60, 629, 649, 658, 661, 691, 722, 726; 716/1–4, 8, 489

(56) References Cited

PUBLICATIONS

Wurtz, GaAsFET and HMET Small–Signal Parameter Extraction from Measrued S–Parameters, Aug. 1994, IEEE, vol. 43, pp. 655–658.*

Sommer, A New Method to Determine the Source Resistance of FET from Measured S–Parameters Under Active–Bias conditions, Mar. 1995, IEEE, vol. 43, pp. 504–510.*

* cited by examiner

Primary Examiner—Marc S. Hoff
Assistant Examiner—Elias Desta

(57) ABSTRACT

A method of uniquely extracting both intrinsic and parasitic components from a single set of measured S-parameters is useful for extracting a single set of measured S-parameters for the development of non-linear Field Effect Transistor (FET) models. Competitive extraction where multiple trial solutions are attempted spanning a region or space of feedback impedances is used. Extraction is followed by optimization that reduces the extracted values to a model that better fits measured S-parameters. Optimization can be achieved by further evaluating the speed of convergence in an error metric.

25 Claims, 13 Drawing Sheets

Frequency 0.05 to 40.05 GHz

Measured S-parameters from a HCA4200ABP Device. 2V 100% idpk. Measured Data from GTPA4/A-1 Wafer 667-127

Measured S-21 from a HCA4200ABP Device. 2V 100% idpk.
Measured Data from GTPA4/A-1 Wafer 667-127

Measured vs. Initial Minasian Extracted Model for S21
HCA4200ABP Device. 2V 100% idpk.
Measured Data from GTPA4/A-1 Wafer 667-127

Frequency 0.05 to 40.05 GHz

Measured vs. Final Model Solution for S-parameters
HCA4200ABP Device, 2V 100% idpk
Measured Data from GTPA4/A-1 Wafer 667-127

Measured vs. Final Model Solution for S21
HCA4200ABP Device. 2V 100% idpk.
Measured Data from GTPA4/A-1 Wafer 667-127

METHOD FOR UNIQUE DETERMINATION OF FET EQUIVALENT CIRCUIT MODEL PARAMETERS

CROSS-REFERENCE TO RELATED APPLICATIONS

This application is related to the following commonly-owned co-pending patent applications all filed on Apr. 28, 2000, which are incorporated herein: S-PARAMETER MICROSCOPY FOR SEMICONDUCTOR DEVICES, by Roger Tsai, Ser. No. 60/200,307; EMBEDDING PARASITIC MODEL FOR PI-FET LAYOUTS, by Roger Tsai, Ser. No. 60/200,810, SEMI-PHYSICAL MODELING OF HEMT DC-TO-HIGH FREQUENCY ELECTROTHERMAL CHARACTERISTICS, by Roger Tsai, Ser. No. 60/200,648, SEMI-PHYSICAL MODELING OF HEMT HIGH FREQUENCY NOISE EQUIVALENT CIRCUIT MODELS, by Roger Tsai, Ser. No. 60/200,290, SEMI-PHYSICAL MODELING OF HEMT HIGH FREQUENCY SMALL-SIGNAL EQUIVALENT CIRCUIT MODELS, by Roger Tsai, Ser. No. 60/200,666, HYBRID SEMI-PHYSICAL AND DATA-FITTING HEMT MODELING APPROACH FOR LARGE SIGNAL AND NONLINEAR MICROWAVE/MILLIMETER WAVE CIRCUIT CAD, by Roger Tsai and Yaochung Chen, Ser. No. 60/200,622, and $PM^2$: PROCESS PERTURBATION TO MEASURED-MODELED METHOD FOR SEMICONDUCTOR DEVICE TECHNOLOGY MODELING, by Roger Tsai, Ser. No. 60/600,302.

This application claims benefit of provisional application 60,200,436 filed Apr. 28, 2000.

FIELD OF THE INVENTION

The present invention relates generally to the field of high frequency small signal analysis and more specifically to a modeling method for extracting a single set of equivalent circuit model parameters that specifically simulate measured S-parameters, but are also useful in the development of non-linear Field Effect Transistor (FET) models, and analysis of the physical structure of the FET.

BACKGROUND OF THE INVENTION

There is a need for a high-frequency nonlinear FET modeling algorithm that will produce a unique solution from measured S-parameters. The problem relates to the difficulty in uniquely determining the feedback impedance of a Field Effect Transistor (FET). Present modeling techniques generate non-unique models for fitted S-parameters or require multiple measurements at different bias points (i.e., cold FET measurements) to satisfy uniqueness. Both of these modeling strategies present problems for nonlinear FET modeling. Non-unique models consist of parameters that are not physically consistent with the FETs fabrication parameters, such as layout dimensions and material parameters. In addition, the cold-FET based model extraction methods do not express the bias-dependence of parasitic elements correctly.

Another disadvantage of prior art equivalent circuit model techniques is that they assume that the parasitic components are constant with bias when they almost certainly are not. This assumption leads to inaccuracies in the extraction of the intrinsic equivalent circuit. The precise determination of the parasitic, especially the resistive, components directly determines the accuracy of the extraction because the calculated values of the intrinsic components depend on them. In particular, the accurate extraction of feedback resistance in a FET is critical to determining the accurate values for all other components.

While most direct extraction techniques rely on cold FET measurements to determine values for the parasitic components, optimization based techniques often use over-dimensioned sets of multi-bias S-parameter (and noise response) delete measurements. In either case, the resistive value of the parasitic components are kept constant even though they can be highly bias-dependent. Because of this, the results of direct extraction based on cold FET parasitics suffer from inaccuracies as bias changes. Although optimized extractions may be attempted to compensate for the parasitic bias dependence, they cannot provide a unique solution to the equivalent circuit because the feedback impedance cannot be uniquely determined with conventional optimization algorithms. This uncertainty often leads to results that are not physically significant, even though they may be accurate for fitting measured S-parameters.

Thus, there is a need for a modeling method that can extract an accurate and unique model solution to a single set of measured S-parameters to develop nonlinear FET models that are both accurate and physically significant.

SUMMARY OF THE INVENTION

The present invention provides a FET modeling algorithm that generates a unique solution for FET feedback impedance, thus determining resistive, capacitive, and inductive equivalent circuit parameter values based on a single set of S-parameter measured values. The subsequent extracted circuit model is a unique global solution rather than a non-unique local minima. In addition, the extracted values satisfy self-consistent checks such as scaling with FET device periphery, expected bias-dependence, and convergence to known fabrication parameters such as gate metalization resistance, material sheet resistance, gate length and recess dimensions.

Disclosed in one embodiment is a method of uniquely determining the feedback impedance values for a FET device. The method includes the step of competitive extraction where multiple trial solutions are attempted spanning a region or "space" of feedback impedance values. Each solution in the competitive extraction can be achieved by utilizing the same cycle of conventional direct extraction via Minasian extraction. Next, the extraction step is followed by an optimization step that reduces the extracted values to a model that better fits measured S-parameters. This optimization step can be achieved by conventional optimization algorithms. Last, selection of the most accurate and unique trial solution can be achieved by further evaluating the speed of convergences in an error metric.

Also disclosed is a method for unique determination of FET equivalent circuit parameter values, the method comprising the steps of selecting a feedback impedance value from a space of expected parameter values and generating a FET equivalent circuit model. The method further includes the step of establishing those parameter values for the circuit model that converge fastest so that a sufficiently low error fit between the expected S-parameters and the measured S-parameter is obtained, the convergence obtained using multiple Minasian extraction and optimization cycles.

A technical advantage of the invention is that by tracking the speed of convergence, the solutions surrounding unique, physically significant models condense faster than the rest. Conventional techniques stop once some least-squares based error metric is minimized.

Another technical advantage of the invention, is the development of unique models that best represents the physical structure of a FET. This has been proven through extensive verification and testing.

BRIEF DESCRIPTION OF THE DRAWINGS

Other advantages of the invention including specific embodiments are understood by reference to the following detailed description taken in conjunction with the appended drawings in which.

References in the figures correspond to like references in the detailed description unless otherwise indicated.

DETAILED DESCRIPTION OF THE PREFERRED EMBODIMENTS

The present invention is a unique and novel method of extracting both intrinsic and parasitic equivalent circuit parameter values for a FET device (not shown). This capability is vital for the generation of accurate high-frequency nonlinear FET circuit models. Accurate bias dependent and linear equivalent circuits are not only important to circuit design, but are also needed to provide a close description of the physical structure of a device for process feedback.

The description of the invention is presented in connection with the small signal circuit model upon which the extraction method of the present invention has been used to extract feedback resistance values between the gate, source and drain terminals of the circuit model. A process flow diagram illustrating the competitive extraction method of the invention is shown and described with reference to a specific example. Next, a set of plots are presented for various circuit model parameters such as the source resistance ($R_s$), the gate-to-source capacitance ($C_{GS}$), the transconductance ($G_M$), the gate-source, gate-drain line capacitance ($C_{GS}$, $C_{DG}$) and the percentage error in the gate source line capacitances as a function of gate-source voltage ($V_{GS}$) and total device periphery. Ultimately, the plots are evidence of convergence between a set of measured device parameter values and extracted parameter values so that the error between the two values sets is minimized.

Figure 1:
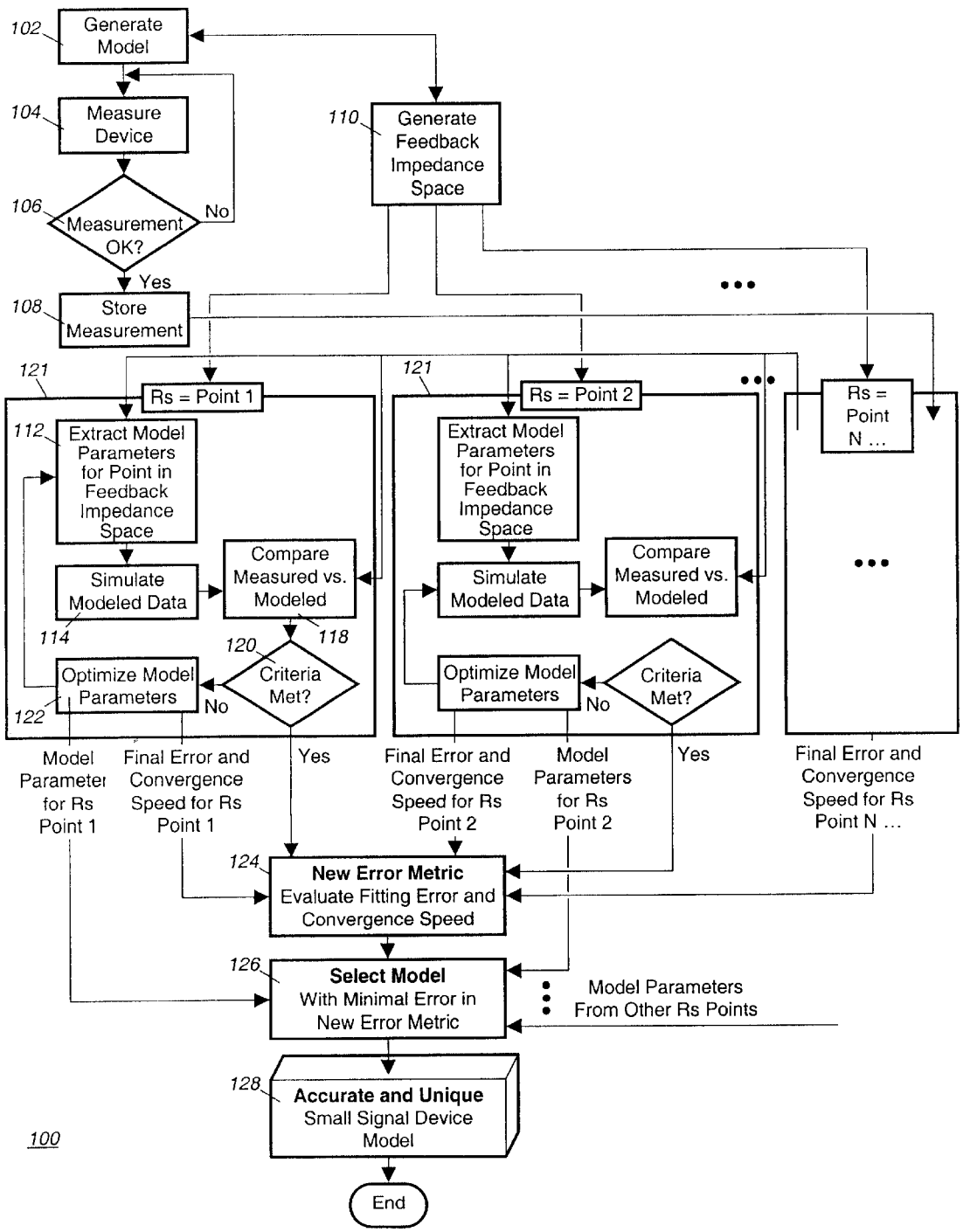
FIG. 1 is a process flow diagram illustrating the extraction and convergence method of the present invention according to one embodiment.
Figure 2:
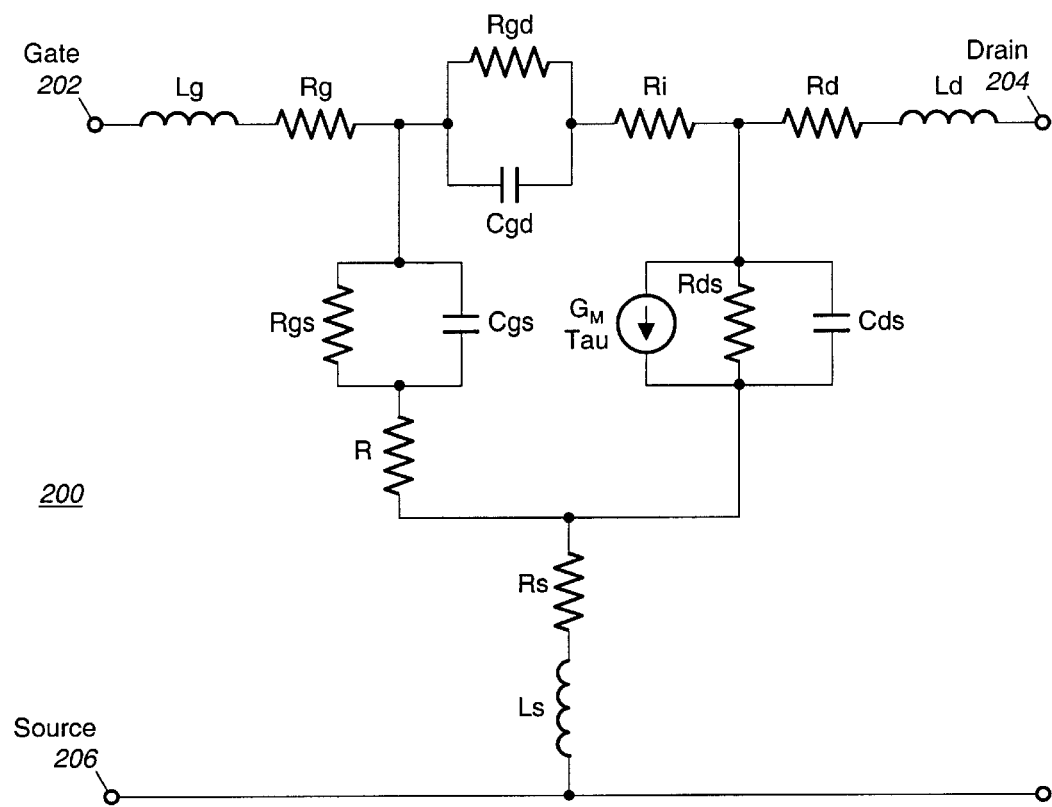
FIG. 2 shows an example FET equivalent circuit.

Reference is now made to FIGS. 1 and 2 in which FIG. 1 is a process flow diagram of a method, denoted generally as 100, of determining unique FET parameter values of a FET device (not shown). The method uses S-parameters which are measured on the FET device as well as S-parameters calculated from a circuit model to determine the parameters of the FET device. The present invention provides a method of extracting realistic parameter values for the circuit model 200 that accurately reflect the FET device modeled by the circuit 200. For clarity of explanation, the method 100 will be described with reference to a specific example.

The method 100 begins at step 102 wherein a circuit model which is representative a FET device is generated. Referring to FIG. 2, therein is shown an example equivalent circuit model of a FET device, denoted generally as 200, on which the extraction algorithm of the present invention can be applied to extract a unique set of circuit parameter values. The topology of circuit model 200 is complete enough to model most FET small-signal characteristics in all bias regimes. The circuit model 200 includes gate 202, drain 204 and source 206 terminals with an assortment of resistance, impedance and capacitance parameters extending between the gate 202, drain 204, and source 206 terminals. These parameters include the source resistance $R_s$, the gate-source capacitance $C_{GS}$, and the transconductance $G_M$, among others as indicated in the figure. The circuit model 200 represents an ideal FET device suitable for demonstration of the ability to uniquely and accurately determine the FET feedback impedance through a single set of measured S-parameter values according to the invention.

Generally, in deriving the circuit model 200, a designer will consider the operating frequency and bias condition of the FET device to be modeled as carriers enter the device through the source 206 and leave through the drain 204 subject to the control or gating action of the gate terminal 202. For a FET device, the voltages applied to the gate relative to the source ($V_{GS}$) can determine the operating region of the device as $V_{GS}$ is increased from zero to a threshold voltage level ($V_T$) that biases the device into its active region. The biasing and operation of devices represented by the circuit model 200 are well understood by those of ordinary skill in the art.

The model 200 contains circuit parameters and components, designated as Rs, Ls, Rg, Lg, Rd and Ld. The selection of the initial inductance (L), resistance (R), transconductance (G) and capacitance (C) values for the various components of the circuit model 200 is straightforward when it is assumed the performance of the underlying device is linear with frequency. (Such assumptions, however, prove inaccurate for most FET device models since most are non-linear at high frequencies and given actual device profiles peripheries. This assumption however does provide an initial starting point for the method of the present invention).

Figure 3:
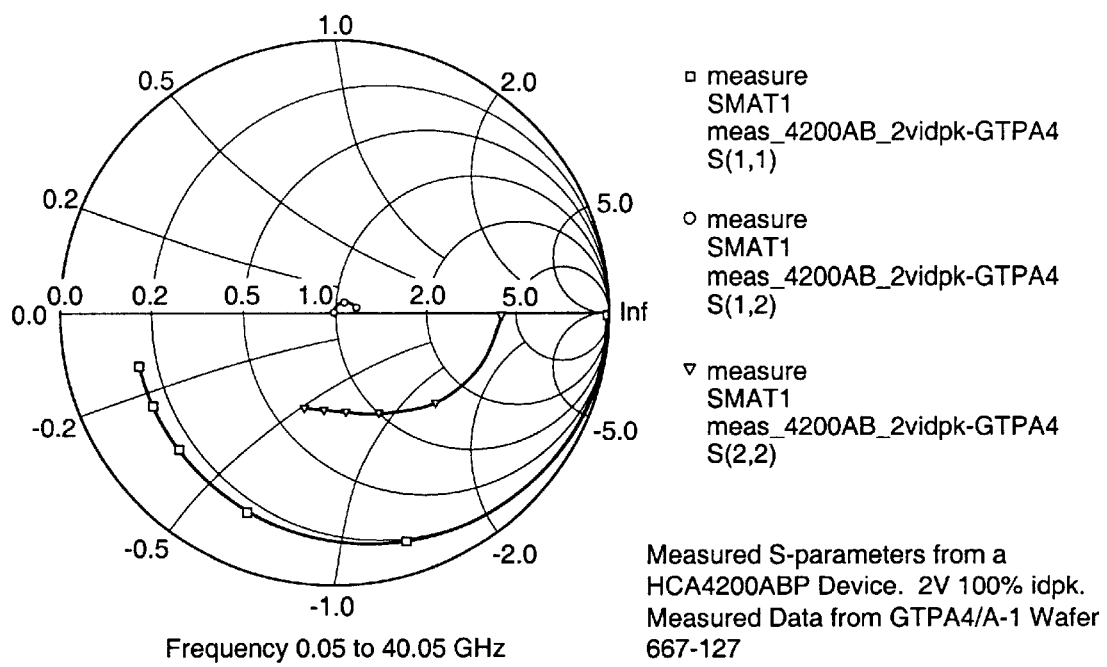
FIGS. 3 and 4 show plots illustrating measured S-parameters for a FET device.
Figure 4:
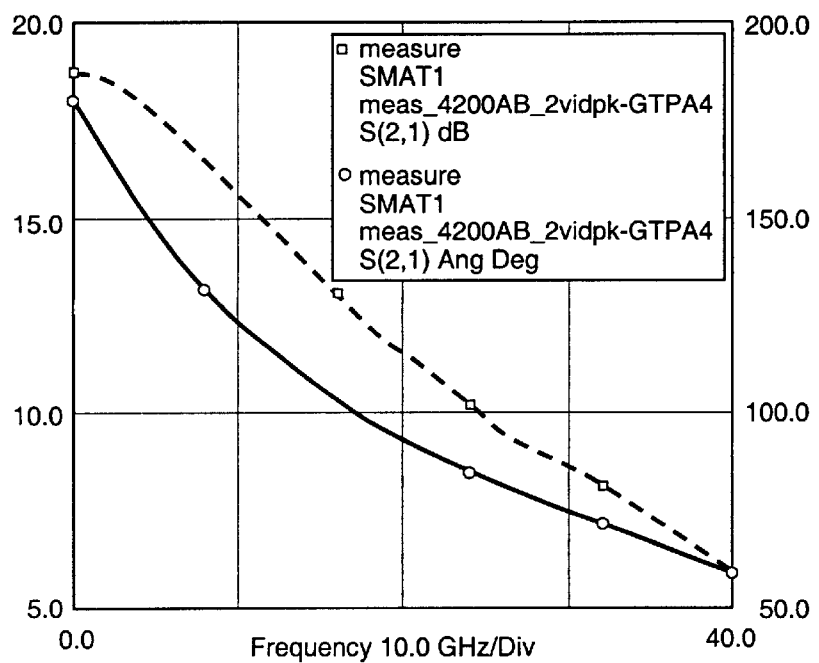

The next step in the process is to measure the S-parameters for the FET device, step 104. To do so, the FET device is physically tested and measured and the S-parameters for the FET device are determined. A determination is then made as to whether the measurements and the associated measured S-parameter values are accurate, step 106. To do so requires the knowledge of one skilled in the art. If the parameters are not accurate, the S-parameters are remeasured until the measurements are acceptable. FIGS. 3 and 4 show visual examples of measured FET S-parameters for a selected FET device. Note that four S-parameter measurements are shown in which three are depicted in a Smith Chart format (FIG. 3) and one is shown in a linear graph format (FIG. 4). Assuming the measured S-parameters are accurate, the measured S-parameters are stored, step 108, for use during subsequent comparison.

Referring back to FIG. 1, at some point in the process, the space defining all values for trial feedback impedance solutions is generated, step 110. For example, the trail feedback impedance space could be as shown in Table 1. The trial values are used to generate a set of feedback resistance values or points. The points can be thought of as extending from one (1) to N, where N is in the Nth trial feedback impedance solution in the space generated at step 110. The example shown in Table 1 shows thirty (30) trial points such that N=30 for this example.

The next step in the process, step 112, is to extract model parameters for each point, N, in the feedback impedance space generated at step 110. To do so, using the example trail space shown in Table 1 and the circuit model 200 shown in FIG. 1, the values of Rs and Ls for each impedance point, N=1 to 30, is applied to the circuit model of FIG. 1 and values for Cgs, Rgs, Cgd, Rgd, Cds, Rds, Gm and Tau are extracted for each impedance point, N =1 to 30, using algorithms and techniques well known to one skilled in the art. The extractions are preferably achieved by utilizing Minasian extraction algorithms which are known in the art. A more detailed description of these algorithms and their use can be found in "Broad-Band Determination of the FET Small-Signal Equivalent Circuit" by M. Berroth et al. IEEE-MTT vol. 38, no. 7, July 1990. Example model parameters for one impedance point, N=17, Rs=1.7 ohms and Ls=0.0045 pH (Table 1) are shown in Table 2. Note that a similar table will be generated for each impedance value in the trial solution space. As such, for the trial space depicted by Table 1, thirty (30) tables of model parameter values will be generated.

TABLE 1

Trial starting feedback impedance space point values.

| Impedance Point (N) | Resistance (Rs) | Inductance (Ls) |
|---|---|---|
| 1 | 0.1 Ω | 0.0045 pH |
| 2 | 0.2 Ω | 0.0045 pH |
| 3 | 0.3 Ω | 0.0045 pH |
| 4 | 0.4 Ω | 0.0045 pH |
| 5 | 0.5 Ω | 0.0045 pH |
| 6 | 0.6 Ω | 0.0045 pH |
| 7 | 0.7 Ω | 0.0045 pH |
| 8 | 0.8 Ω | 0.0045 pH |
| 9 | 0.9 Ω | 0.0045 pH |
| 10 | 1.0 Ω | 0.0045 pH |
| 11 | 1.1 Ω | 0.0045 pH |
| 12 | 1.2 Ω | 0.0045 pH |
| 13 | 1.3 Ω | 0.0045 pH |
| 14 | 1.4 Ω | 0.0045 pH |
| 15 | 1.5 Ω | 0.0045 pH |
| 16 | 1.6 Ω | 0.0045 pH |
| 17 | 1.7 Ω | 0.0045 pH |
| 18 | 1.8 Ω | 0.0045 pH |
| 19 | 1.9 Ω | 0.0045 pH |
| 20 | 2.0 Ω | 0.0045 pH |
| 21 | 2.1 Ω | 0.0045 pH |
| 22 | 2.2 Ω | 0.0045 pH |
| 23 | 2.3 Ω | 0.0045 pH |
| 24 | 2.4 Ω | 0.0045 pH |
| 25 | 2.5 Ω | 0.0045 pH |
| 26 | 2.6 Ω | 0.0045 pH |
| 27 | 2.7 Ω | 0.0045 pH |
| 28 | 2.8 Ω | 0.0045 pH |
| 29 | 2.9 Ω | 0.0045 pH |
| 30 | 3.0 Ω | 0.0045 pH |

TABLE 2

Initial "Intrinsic" equivalent circuit parameters.

| Intrinsic Equivalent Circuit Parameter | Initial Solution |
|---|---|
| Cgs | 0.23595 pF |
| Rgs | 91826 Ω |
| Cgd | 0.0177 pF |
| Rgd | 100000 Ω |
| Cds | 0.04045 pF |
| Rds | 142.66 Ω |
| Gm | 142.1025 mS |
| Tau | 0.1 pS |

The next step in the process, step 118, is to compare the measured S-parameters to the modeled S-parameters. To do so, an initial guess at the model solution is made for the initial parasitic values. This initial guess is an informed guess made by one skilled in the art. An example of an initial guess for the parasitic circuit parameters Rs, Lg, Rs, Ls, Rd and Rd, for model circuit 200 are shown in Table 3. The intrinsic and extrinsic values are applied to the circuit model and the S-parameters are calculated for the model circuit. For example, the intrinsic values shown in Tables 2 and 3 as well as the values for Rs and Ls for each impedance point, N shown in Table 1, is applied to the circuit model 200 and the S-parameters are calculated for each impedance point, N, preferably using a Minasian extraction algorithm mentioned above.

Figure 5:
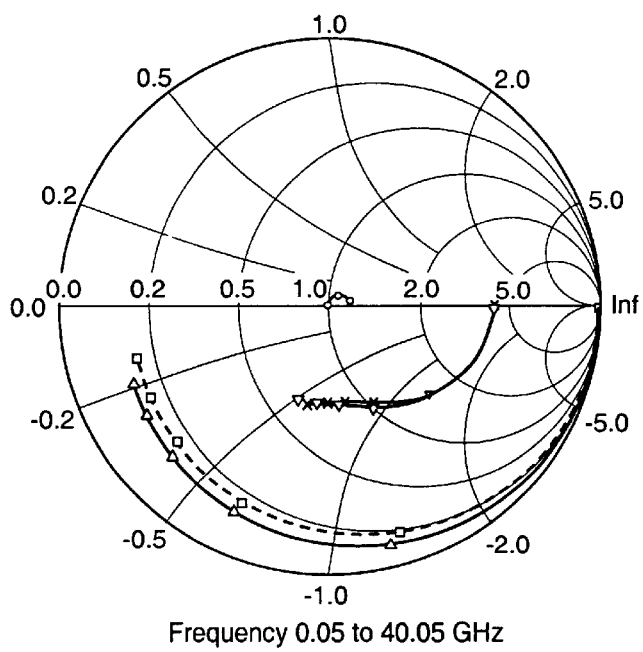
FIGS. 5 and 6 show plots comparing initial modeled S-parameters with measured S-parameters.
Figure 6:
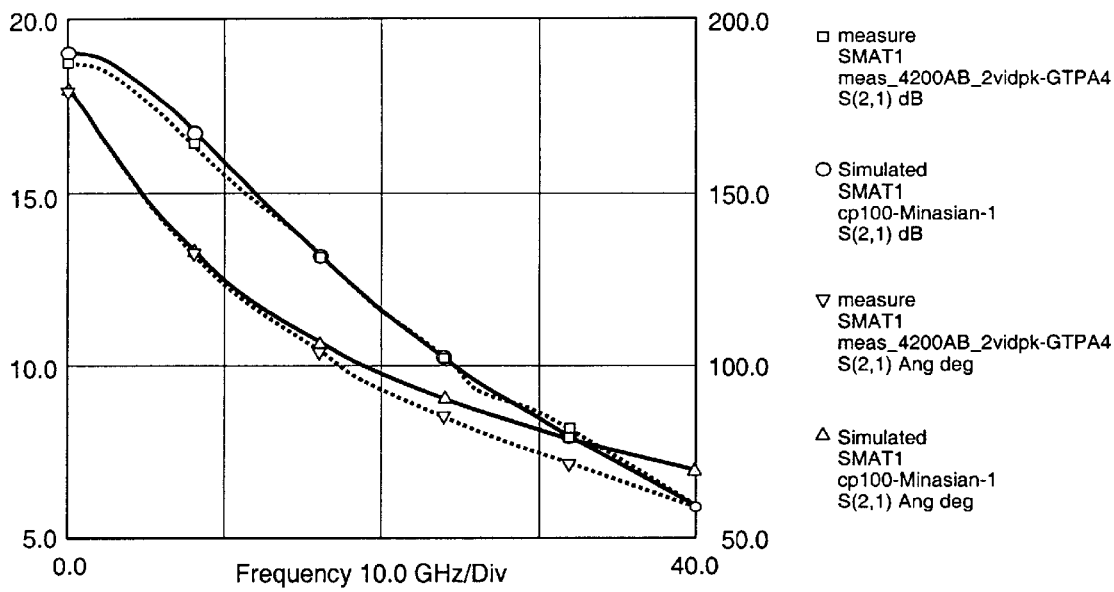

After the S-parameters are calculated for the model circuit, the next step in the process, step 118, is to compare the calculated S-parameters to the measured S-parameters for each impedance point, N, where the measured S-parameters were stored in step 108. FIGS. 5 and 6 are shown to visually illustrate the comparison of calculated and measured S-parameters for one of the impedance points (N=17, Rs=1.7 and Ls-0.0045). The measured values for the S11, S12 and S22 parameters are depicted by the curves identified by the squares, circles and inverted diamonds, respectively. And, the simulated or modeled values for S11, S12 and S22 are depicted by the lines marked by the triangles, diamonds and stars, respectively. It is noted that in actuality, the difference between the measured and modeled S-parameters would typically not be easily discernable on a Smith Chart or a linear plot due to the lack of fidelity of these types of plots. As such, a computer program is used to compare the difference between the measured and modeled S-parameter values. One typically measure of the closeness of the measured and modeled values is the best fit error which is easily calculable with the aid of a computer. A low best fit error indicates that the measured and modeled S-parameter values closely align.

TABLE 3

Initial "Parasitic" equivalent circuit parameters.

| Intrinsic Equivalent Circuit Parameter | Initial Solution |
|---|---|
| Rg | 3.0 Ω |
| Lg | 0.014 nH |
| Rs | 1.7 Ω |
| Ls | 0.0045 nH |
| Rd | 2.5 Ω |
| Ld | 0.024 nH |

The next step in the process, step 122, is to select a test parameter criteria and determine if that criteria has been met. The test parameter criteria can be selected amount of time or a selected number of runs. The selected criteria will be the same for each trial value. The preselected criteria is preferably a preselected number of cycles of the extraction-optimization routine indicated by the box marked 121. In this manner, each feedback resistance value (1-N, where for the example of Table 1, N=30) is subjected to the same criteria. As such, the feedback resistance value which starts off closest to the unique solution will contain the least amount of error and converge faster and obtain a low best fit value quicker. For our example, the preselected criteria was completion of six (6) extraction-optimization cycles where one cycle is depicted by the subroutine indicated by reference number 121.

The next step in the process, step 122, is to optimize the model parameters. To do so, known optimization programs are used. For example, a commercially available computer program, Libra 3.5, produced by HP EEsof could be used as the optimizer program. The optimization is additionally performed per preselected restrictions. For example, the optimization program Libra 3.5 could be used with the restrictions shown in Table 4 for a fixed value of Rs. These constraints are in accordance with the overall modeling algorithm. By fixing the value of Rs, for example to a value of 1.7 ohms, the optimization of the model parameters is confined to creating a trial model solution for only the trial feedback impedance point, Rs. The optimized values for the equivalent circuit parameters are output from the optimization program. Tables 5 and 6 show example optimized equivalent circuit parameters for the circuit 200 (FIG. 2), are output from the Libra 3.5 computer program. As previously mentioned, Rs is a fixed value for the cycles.

TABLE 4

Environment used for competitive solution strategy, as implemented in this example.

| Implementation Parameter | |
| --- | --- |
| Circuit Simulator and Optimizer | Libra 3.5 |
| Optimization Algorithm | Gradient |
| Optimization Error Metric | Mag and angle of S11, S21, S12, and S22 from 4 to 40 GHz |
| Number of Iterations | 60 |
| Number of Extraction/Optimization Cycles | 6 |

TABLE 5

Optimized "Intrinsic" equivalent circuit parameters.

| Intrinsic Equivalent Circuit Parameter | Initial Solution |
| --- | --- |
| Cgs | 0.227785 pF |
| Rgs | 65247 Ω |
| Cgd | 0.017016 pF |
| Rgd | 130820 Ω |
| Cds | 0.047521 pF |
| Rds | 160.18 Ω |
| Gm | 135.74 mS |
| Tau | 0.446 pS |

TABLE 6

Optimized "Parasitic" equivalent circuit parameters.

| Intrinsic Equivalent Circuit Parameter | Initial Solution |
| --- | --- |
| Rg | 4.715 Ω |
| Lg | 0.02903 nH |
| Rs* | 1.7 Ω |
| Ls | 0.002102 nH |
| Rd | 3.2893 Ω |
| Ld | 0.0317 nH |

*Remains fixed for each trial model solution for feedback impedance space.

Figure 7:
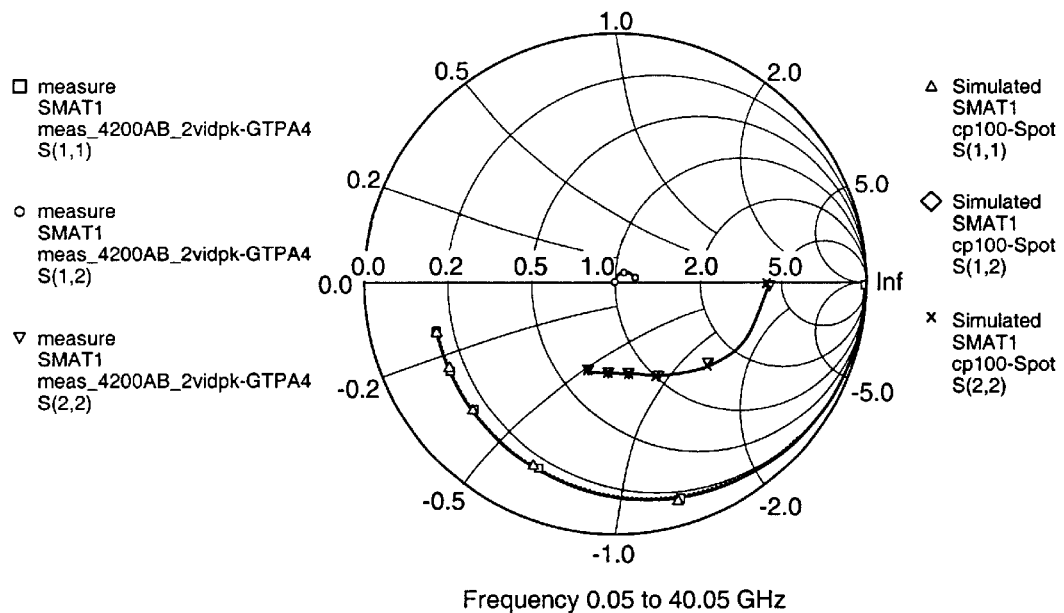
FIGS. 7 and 8 show plots comparing modeled parameters with measured parameters after application of one embodiment of the method of the present invention.
Figure 8:
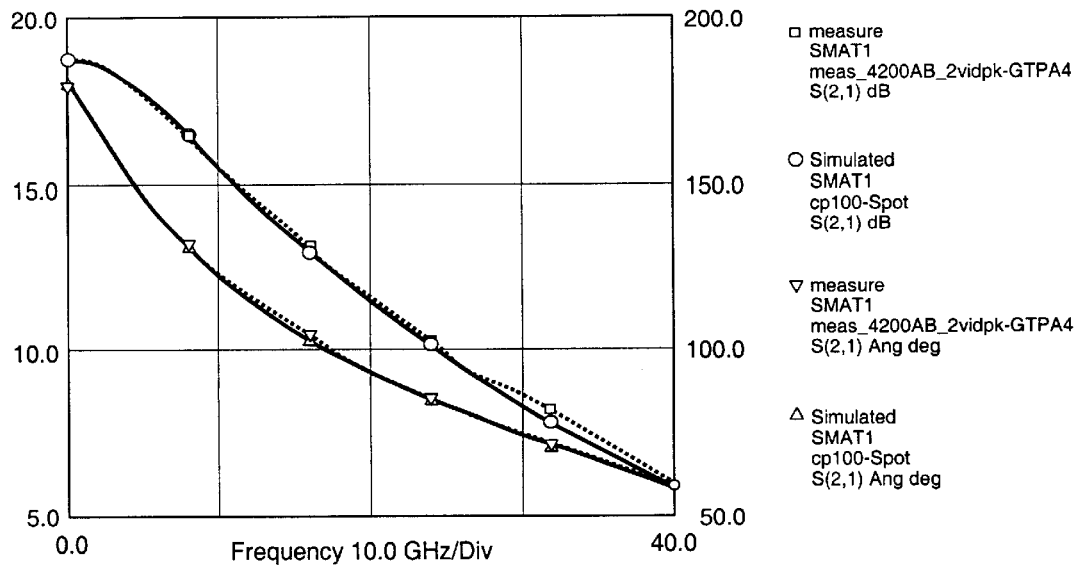

These new optimized parameters are input into step 112 and the process is repeated. The steps 112–122 are repeated until the preselected criteria is met at step 120 for each trial solution point. With each repetition of the process, the modeled values more closely match with the measured values. For example, FIGS. 7 and 8 visually depict a comparison of the measured and simulated S-parameter values after six (6) extraction-optimization cycles 121 for the circuit model 200 of FIG. 2. When FIGS. 7 and 8 are compared to FIGS. 4 and 5, respectively, it can be seen that the measured and modeled values converge with application of the process 100.

Figure 9:
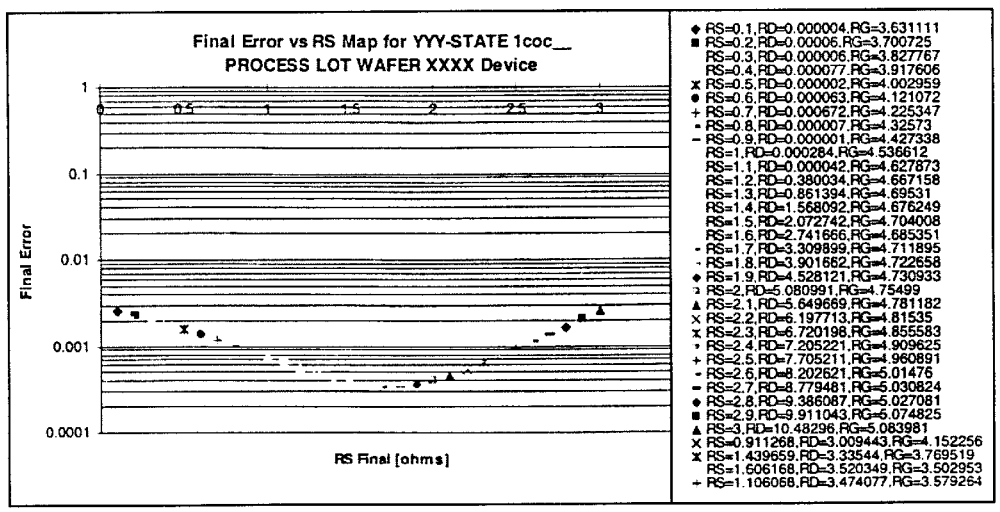
FIG. 9 is a plot illustrating final fitting of extracted parasitic feedback resistance values obtained using the method of the present invention for the circuit of FIG. 2.

The next step in the process is to form a new error metric, step 124. To do so, the final error and convergence speed for each of the trial solution points are compared to determine which trial solution produced the lowest final error. For example, the graph of FIG. 9 shows the final fitting error for the circuit model 200 as a function of Rs, where Rs is plotted along the horizontal axis with the appropriate scaling factors for fitting the error indicated along the vertical axis. Not that a final fitting error is generated for each trail solution point, N.

The next step in the process is to select the model solution which resulted in the minimal error in the new error metric, step 126. Since each trial solution point was subjected to the same preselected criteria, for example, six (6) cycles at step 120, the implementation of the extraction-optimization cycles results in the best and the fastest solving model solution appear as the global minima, depicted by reference number 127, for the final fitting errors of all trial impedance points. For the example depicted by the graph of FIG. 9, the minima 127 occurs for an Rs value of approximately 1.7 ohms. The minima 127 in final error indicates that the algorithm of the present invention converges to a unique solution as opposed to conventional algorithms which would produce near flat dependencies or local minima solutions which do not usually obey device scaling realities. Thus, with unique solutions for the feedback resistance, the rest of the equivalent circuit model 200 can be uniquely determined.

The next step in the process is to output the circuit parameters corresponding to the selected model solution. These circuit parameters were calculated at step 112 for the last cycle of process 121. For example, Tables 7 and 8 depict the final model equivalent circuit parameters for this solution of Rs =1.7 ohms for the circuit model 200 (FIG. 2). By selecting those values which produced the minimal error in the error metric and fast convergence, step 126, an accurate model of the FET device that is unique is obtained at step 128.

TABLE 7

Global solution for "Intrinsic" equivalent circuit parameters.

| Intrinsic Equivalent Circuit Parameter | Initial Solution |
| --- | --- |
| Cgs | 0.227745 pF |
| Rgs | 64242 Ω |
| Cgd | 0.017019 pF |
| Rgd | 133450 Ω |
| Cds | 0.047544 pF |
| Rds | 160.1791 Ω |
| Gm | 135.7568 mS |
| Tau | 0.443867 pS |

TABLE 8

Global solution "Parasitic" equivalent circuit parameters.

| Intrinsic Equivalent Circuit Parameter | Initial Solution |
| --- | --- |
| Rg | 4.711895 Ω |
| Lg | 0.029314 nH |
| Rs | 1.7 Ω |
| Ls | 0.002104 nH |
| Rd | 3.309899 Ω |
| Ld | 0.031671 nH |

Figure 10:
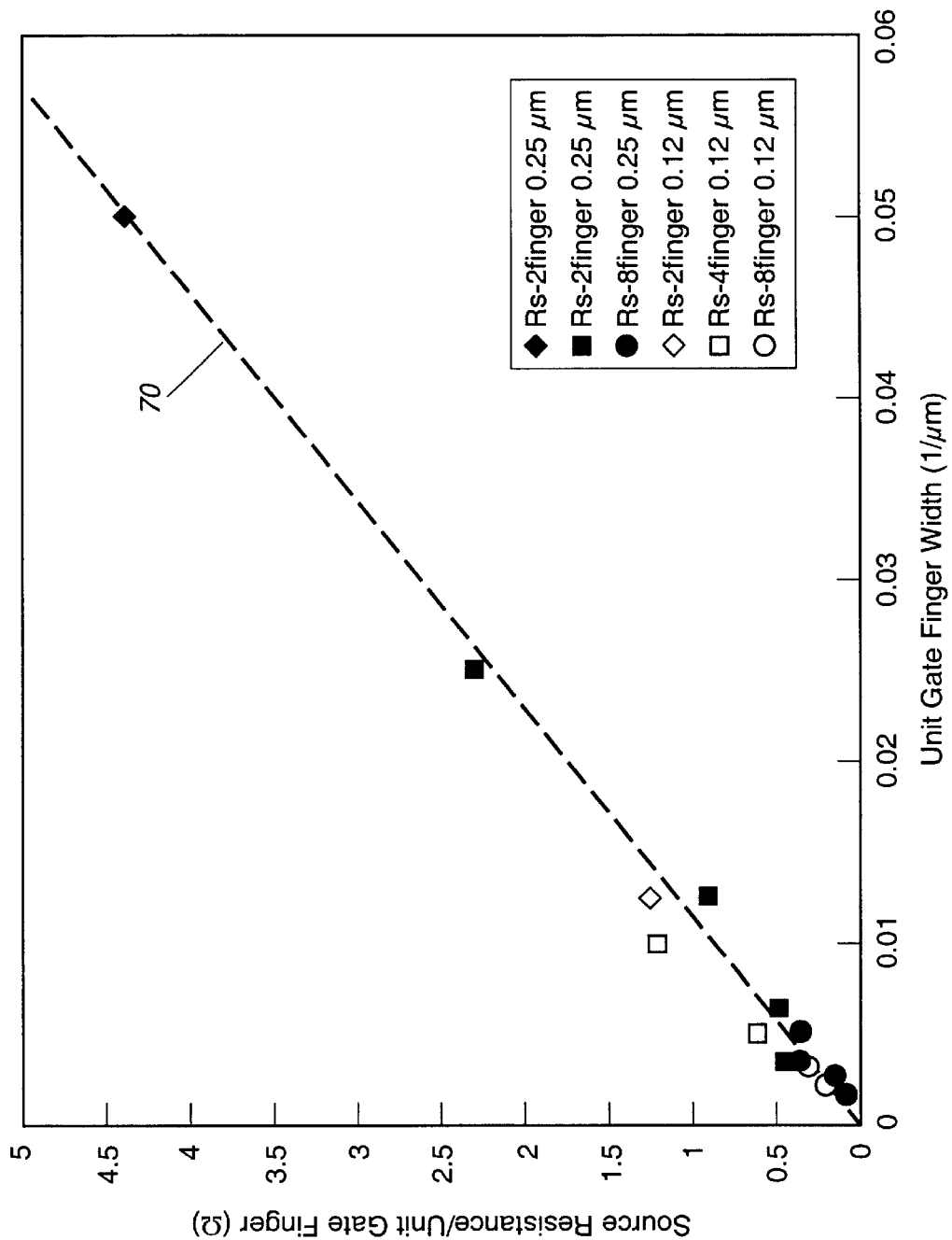
FIGS. 10, 11 and 12 are plots illustrating scaling of extracted values as a function of device periphery scaling.
Figure 11:
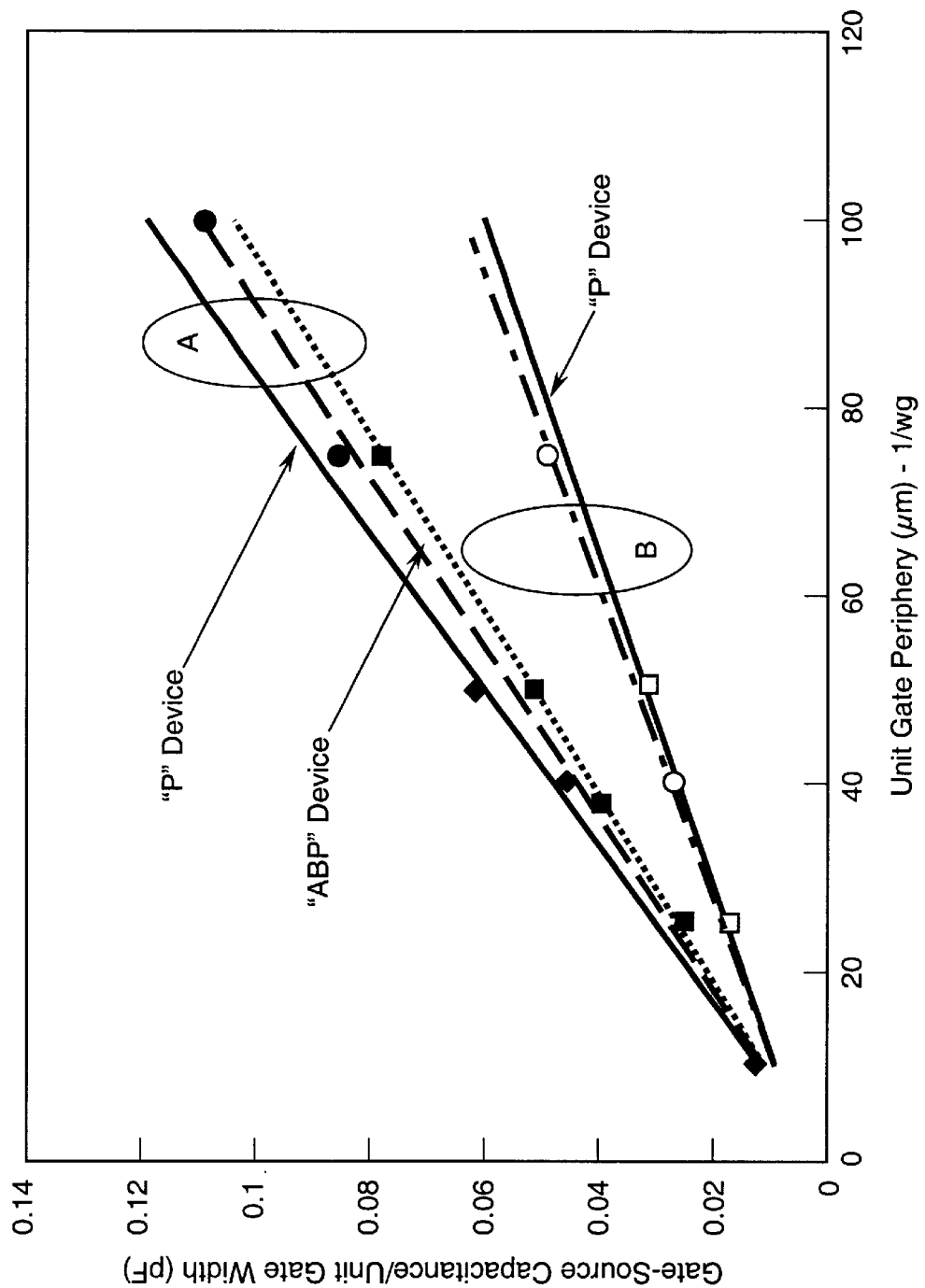
Figure 12:
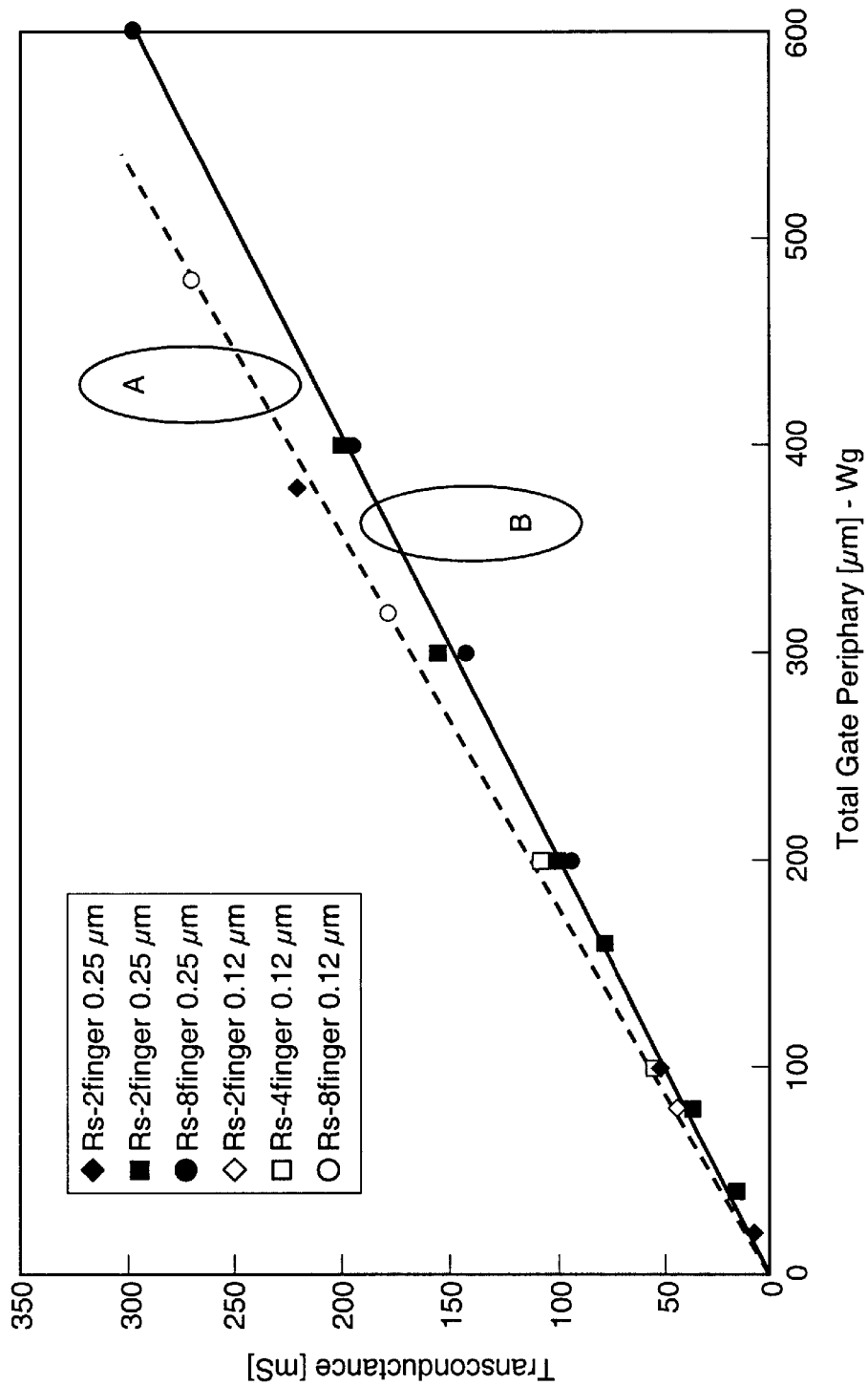

The extracted results are fully consistent with device periphery scaling as shown in FIGS. 10, 11, and 12, respectively. FIG. 10 is a plot of the source resistance as a function of gate width ($W_G$) in 2-finger, 4-finger and 8-finger FET configurations. For all configurations, the source resistance $R_S$ follows roughly the dashed line 70 indicating a direct dependence with $1/W_G$ as would be expected.

FIG. 11 illustrates a plot of the gate source capacitance $C_{GS}$ (indicated along the vertical axis) as a function of $1/W_G$. The extracted values for $C_{GS}$ are plotted for both a 0.25 μm (indicated by the oval A) and a 0.12 μm GaAs pseudomorphic High Electron Mobility Transistor (HEMT, indicated by the oval B). The lines surrounding each device model (either A or B) are indicated from top to bottom as 2, 4, and 8-finger configurations with unit gate periphery indicated along the horizontal axis. As expected, $C_{GS}$ follows a direct dependence with the total gate width periphery $W_G$ for the extracted values.

Further verifications that the extracted parameter values obtained with the method of the present invention is illustrated in FIG. 12, which is a plot of the transconductance $G_M$ as a function of total gate periphery $W_G$. As before, the extracted values are shown for $G_M$ scaled for both in a 0.12 mm (oval A) and a 0.25 mm GaAs pseudomorphic HEMT (oval B). As shown, the transconductance $G_M$ follows a direct dependence with the total gate with $W_G$ as expected.

What is also expected is that $C_{GS}$ would follow closely with gate length $W_G$ because the contact area between the gate and channel mostly determines $C_{GS}$. For a GaAs pseudomorphic HEMT, $R_S$ and, to a large extent $G_M$, do not strongly follow gate length $W_G$ because the recess dimensions are similar, material profiles are identical, and the effect of velocity overshoot is not so pronounced at a given bias. This is verified by the plot of FIG. 11. The robustness and computational accuracy of the algorithm can also be verified using simulated sets of S-parameters generated from known model parameters.

With the improved accuracy of the parameter extraction method of the invention, circuit models can be extracted with physically significant parameters and subtle Physics-based phenomena in FETs can be observed from measured bias dependent S-parameters. In several HEMT model-scaling studies performed with our extraction, the expected gate metal resistance could be determined from well-known scaling rules. These results indicate that the extraction of the parameter $R_G$ was not only accurate, but also physically significant.

Figure 13:
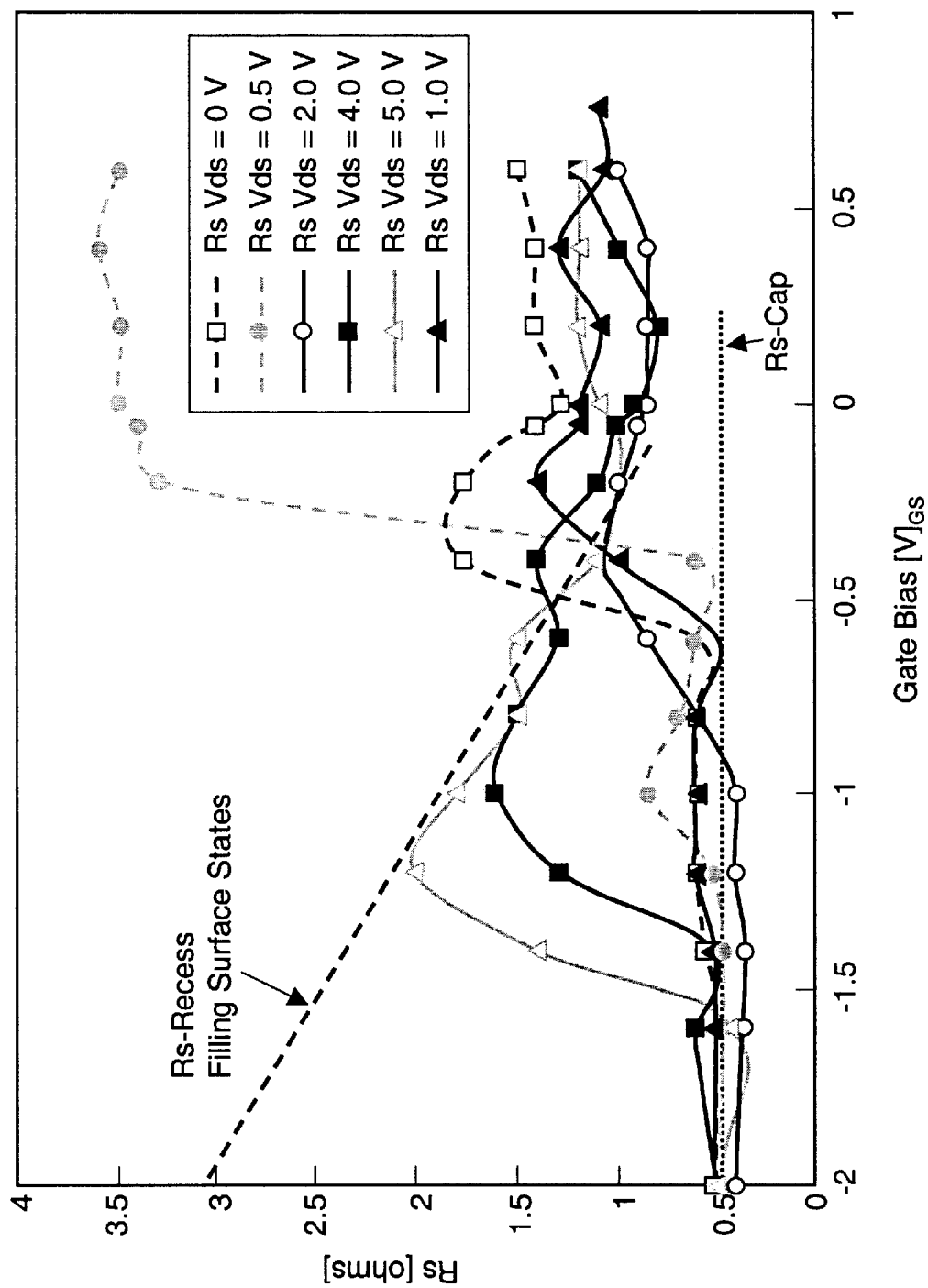
FIG. 13 illustrates the bias dependence of Rs versus Vgs.

FIG. 13 is a plot of the source resistance $R_s$ versus the gate bias voltage $V_{GS}$ plotted along the horizontal axis. In the bias dependent S-parameters of 0.12 μm GaAs pseudomorphic HEMTs, the extraction of both parasitic and intrinsic. equivalent circuit parameter values provide a close view of the physical structure of the device. The lateral extension of the space-charge region and the modulation of surface state density in the recess can be observed in the bias dependence of $R_S$ vs. $V_{GS}$.

Figure 14:
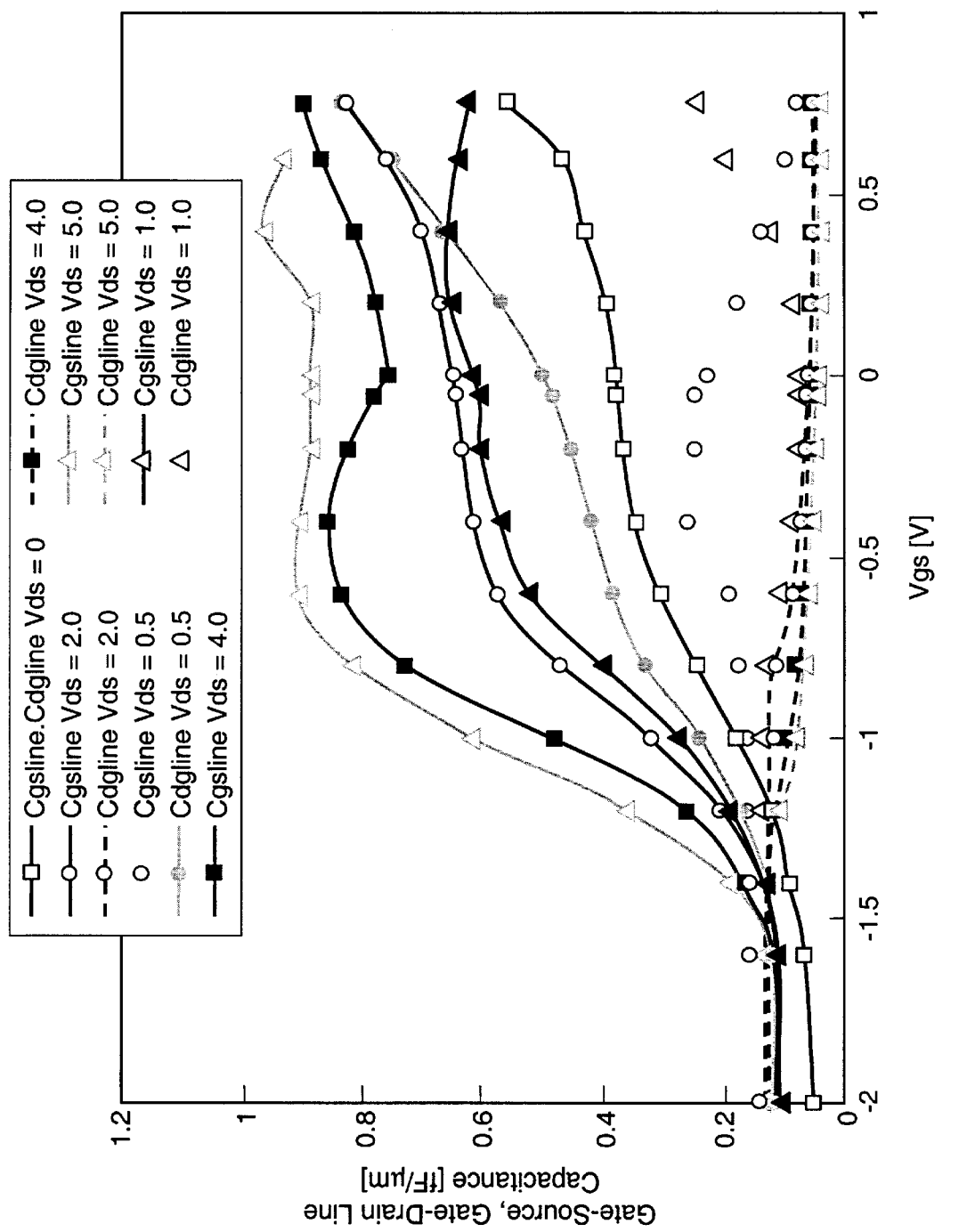
FIG. 14 illustrates the bias dependence of $C_{GS}$ and $C_{GD}$ in a typical HEMT; and, FIGS. 15 and 16 illustrate inaccuracies and expected errors using constant parasitic model parameter values.

The bias dependence of $C_{GS}$ and $C_{GD}$ is typical of HEMTs as confirmed by the reports of many researchers. This bias dependence is illustrated in the bias plot of FIG. 14. At cold FET conditions, $C_{GS}$ and $C_{GD}$ are equal and then gradually $C_{GS}$ increases while $C_{GD}$ decreases as the FET is biased into its linear region. Typically, $C_{GS}$ follows a hyperbolic tangent-like function in saturation with a sharp increase occurring near pinch-off voltage and then saturating to a peak value. Increasing $C_{GS}$ as $V_{GS}$ moves positive is indicative of charge spilling out of the channel and into the donor or Schottky Barrier layer, amounting to an effect sometimes called parasitic conduction.

Increasing $C_{GS}$ as $V_{DS}$ increases is indicative of so-called Drain-Induced-Barrier-Lowering (DIBL). DIBL often occurs in submicron FET devices because the short gate lengths of these devices allow drain potential to influence the channel potential well past the beginning of the gate. The inaccuracies associated with a constant parasitic model extraction can also be investigated. By using the extracted parameters as a control, the intrinsic model parameters can be re-extracted for a 4×200 μm 0.12 Φm GaAs pseudomorphic HEMTs, with the new $R_S$ and $R_D$ set at cold-FET, on-state extracted values of 240 and 250 Ωμm, respectively.

Figure 15:
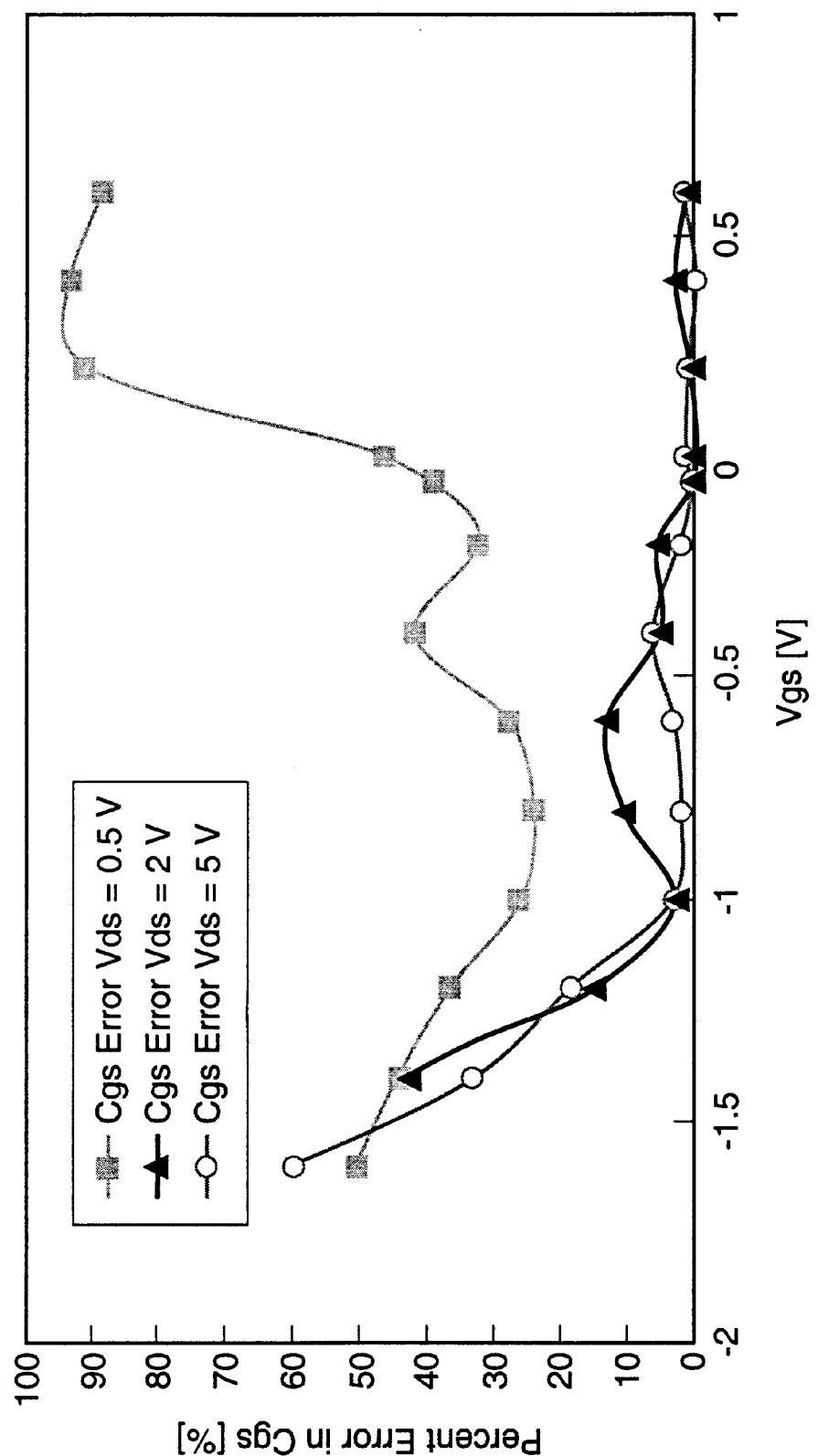
Figure 16:
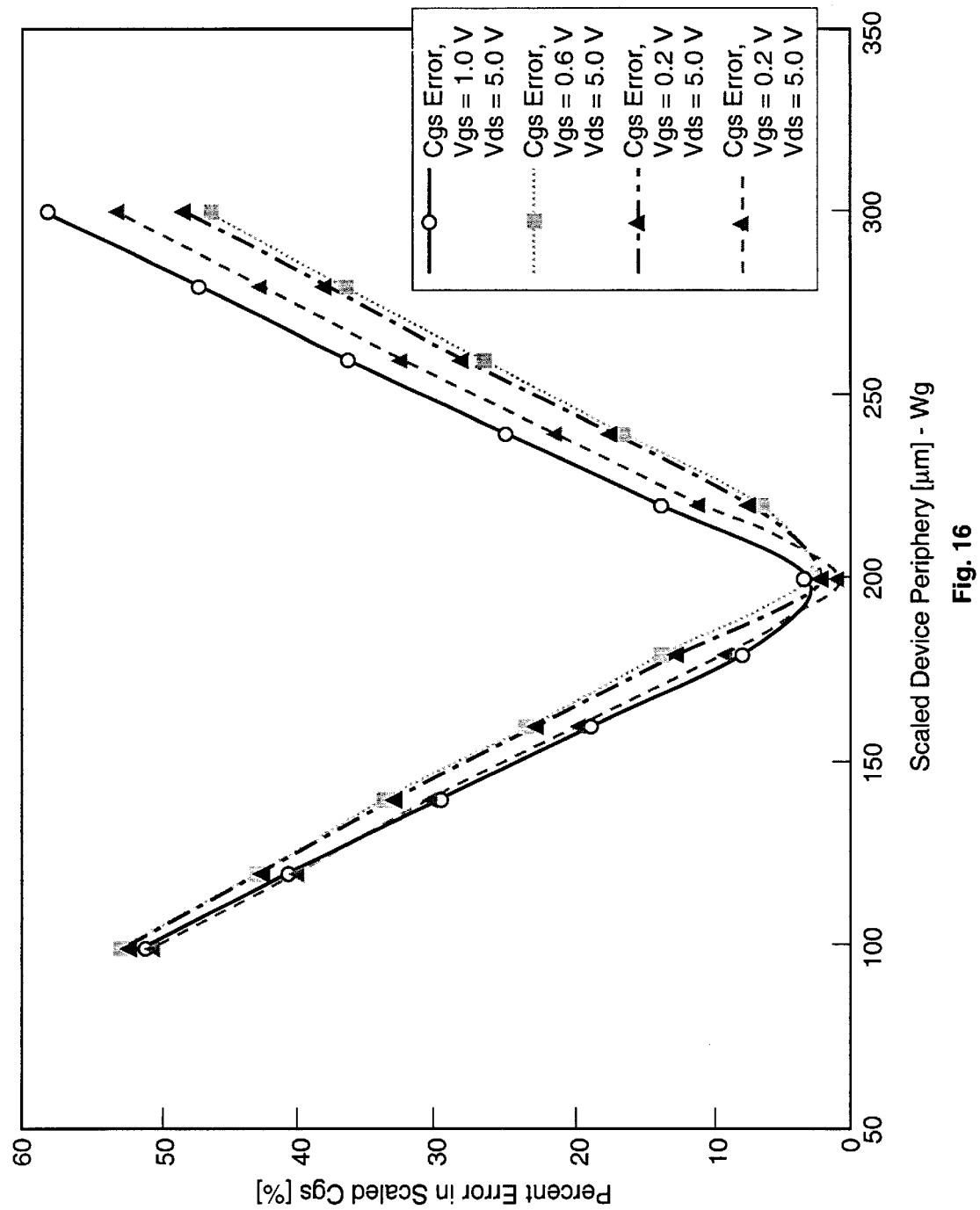

Inaccuracies with bias and periphery scaling caused by this assumption are shown in FIGS. 15 and 16, respectively. In particular, FIG. 15 is a plot showing a percentage error in the gate-source capacitance $C_{GS}$ as a function of the gate source voltage $V_{GS}$. FIG. 16 illustrates percent error in the scaled gate-source capacitance $C_{GS}$ versus scaled device periphery $W_G$, as indicated along the horizontal axis. As can be seen, constant parasitic assumptions become more inaccurate when the FET is biased with $V_{GS}$ approaching pinch-off and as $V_{DS}$ decreases into the linear region. Also, small errors in the fitting of the equivalent circuit caused by assuming constant parasitics with bias are greatly magnified as the device model is scaled. Roughly, a 10% error/20 μm of device scaling occurs simply because the intrinsic model of the original device started with a small error.

While the invention has been described in connection with specific embodiments, it should be understood that variations and modifications of the invention will become apparent to those of ordinary skill in the art without departing from the true scope and spirit of the invention. It is therefore intended that such variations and modification be part of the present invention and encompassed by the following claims.

What is claimed is:

1. A method of generating a set of equivalent circuit parameter values for a FET device comprising the steps of:

measuring a set of S-parameter values associated with the FET device;

generating a circuit model of the FET device;

defining trial Impedance points for the FET circuit model;

extracting model S-parameter values for each trial impedance point for the FET circuit model;

calculating modeled S-parameters from the extracted model parameters for the circuit model for each trial impedance point;

comparing the modeled S-parameters to the measured S-parameters for each trial impedance point;

optimizing the modeled S-parameter values for each trial impedance point by applying a preselected computational resource controlled optimization criteria to each trial impedance point;

calculating an error fit between the optimized S-parameter values and the measured S-parameter values for each trial impedance point; and, determining a set of equivalent circuit parameters for the FET device by selecting the trial impedance point and model parameter values which resulted in a minimum error fit.

2. The method of claim 1, further comprises repeating the extracting, calculating modeled S-parameters and comparing steps until the preselected criteria is met for each trial impedance point.

3. The method of claim 2, wherein applying a preselected criteria comprises applying a preselected number of times the extracting model S-parameter values, calculating model S-parameter values and comparing model S-parameter values steps are conducted for each trial impedance point.

4. The method of claim 1, wherein extracting model parameters comprises extracting model parameters using a Minasian extraction technique.

5. The method of claim 1, wherein extracting model parameters comprises fixing a value of one model parameter and using a Minasian extraction technique to extract other model parameters.

6. A method of generating a set of unique device equivalent circuit parameter values that closely model measured S-parameters for a FET-type device comprising the steps of:

generating a circuit model of the FET-type device;

measuring a set of S-parameters associated with the FET-type device;

extracting equivalent circuit model parameter values associated with the FET-type device, for a fixed value of feedback impedance, representing a trial solution lying in a space containing a set of feedback impedance trial values;

modeling the S-parameters by applying the equivalent circuit model parameters to the circuit model;

determining an error fit between the modeled S-parameters to the measured S-parameters;

optimizing the extracted equivalent circuit parameter values by applying a preselected computational resource limited criteria to each trial impedance point to minimize the error fit between the modeled and the measured S-parameters; and deriving a set of unique equivalent circuit parameters for the device by evaluating the error fit between said set of modeled S-parameters and said set of measured S-parameters, wherein the trial impedance point which converges quickest for said preselected criteria is the trial impedance point that minimizes the error fit.

7. The method according to claim 6 further comprising the step of selecting a set of model parameter values with a minimal error fit between said modeled S-parameters and said measured S-parameters.

8. The method according to claim 6 further comprising the step of generating a space of feedback impedance values for use during said determining step.

9. The method according to claim 6 wherein the step of measuring is followed by the further step of storing said set of parameters associated with the device.

10. The method according to claim 6 further comprising the step of determining if the measured set of S-parameters is confined within a known space of expected S-parameters.

11. The method according to claim 6 wherein the step of optimizing comprises applying multiple trial solutions spanning a known space of expected values to optimize the modeled S-parameters for each trial impedance point.

12. The method according to claim 6 wherein the step of extracting comprises applying Minasian extraction techniques to arrive at model parameter values for said FET device.

13. The method according to claim 6 wherein the step of determining an error fit comprises determining a speed of convergence for each trial impedance point, and, the step of deriving comprises deriving a set of unique equivalent circuit parameters for the FET device by evaluating the speed of convergence for each trial impedance point.

14. The method according to claim 6 further comprising the step of creating an error metric for a set of points with a known space of parameter values.

15. The method according to claim 6 wherein said step of deriving is performed utilizing extracted parameter values that converge fastest to measured S-parameters.

16. A method for unique determination of FET equivalent circuit parameters comprising the steps of:

generating a set of feedback impedance values that define a space of expected parameter values;

generating a FET equivalent circuit model;

applying the feedback impedance values to the circuit model and calculating therefrom modeled S-parameters for each feedback impedance value;

measuring a set of S-parameters from the actual FET;

comparing the measured S-parameter to the modeled S-parameters; and selecting the S-parameter values for the circuit model that converge so that a sufficiently low error fit between the modeled S-parameters and the measured S-parameters is obtained, said convergence obtained using multiple Minasian extraction cycles.

17. The method according to claim 16 wherein said step of selecting is performed so that the selected parameters contains values associated with the fastest convergence between the measured S-parameters and the modeled S-parameters.

18. The method according to claim 16 further comprising the step of storing said measured S-parameters.

19. The method according to claim 16 further comprising the step of creating an error metric based on the error fit between the modeled S-parameters and the measured S-parameters and the speed of convergence.

20. The method according to claim 16 wherein said step of selecting the unique parameters includes selecting resistive, capacitive and inductive equivalent circuit parameters for said FET equivalent circuit model.

21. The method according to claim 20 wherein said step of selecting includes selecting equivalent circuit parameters that represent the physical structure of a device based on said FET equivalent circuit model.

22. The method according to claim 1, wherein said step of optimizing comprises optimizing the modeled S-parameter values for each trial impedance point by applying a preselected computational time limiting criteria to each trial impedance point.

23. The method according to claim 1, wherein said step of optimizing comprises optimizing the modeled S-parameter values for each trial impedance point by applying a preselected computational resource limited criteria to each trial impedance point which comprises fixing constant the number of numeric optimization cycles to each trial impedance point to minimize the error fit between the modeled and the measured S-parameters.

24. The method according to claim 6, wherein said step of optimizing comprises optimizing the extracted equivalent circuit parameter values by applying a preselected computational time limiting criteria to each trial impedance point to minimize the error fit between the modeled and the measured S-parameters.

25. The method according to claim 6, wherein said step of optimizing comprises optimizing the extracted equivalent circuit parameter values by applying a preselected computational resource limited criteria which comprises fixing constant the number of numeric optimization cycles to each trial impedance point to minimize the error fit between the modeled and the measured S-parameters.

* * * * *